United States Patent
Chiao et al.

(10) Patent No.: US 11,658,061 B2
(45) Date of Patent: May 23, 2023

(54) SEMICONDUCTOR SUBSTRATE AND METHOD OF FABRICATING THE SAME

(71) Applicant: Wafer Works Corporation, Taoyuan (TW)

(72) Inventors: Ping-Hai Chiao, Taoyuan (TW); Wen-Chung Li, Taoyuan (TW)

(73) Assignee: Wafer Works Corporation, Taoyuan (TW)

( * ) Notice: Subject to any disclaimer, the term of this patent is extended or adjusted under 35 U.S.C. 154(b) by 21 days.

(21) Appl. No.: 17/376,185

(22) Filed: Jul. 15, 2021

(65) Prior Publication Data
US 2022/0359271 A1    Nov. 10, 2022

(30) Foreign Application Priority Data

May 4, 2021  (TW) .................. 110115973

(51) Int. Cl.
H01L 21/762  (2006.01)
H01L 27/12  (2006.01)
H01L 21/324  (2006.01)
H01L 21/02  (2006.01)

(52) U.S. Cl.
CPC .... H01L 21/76251 (2013.01); H01L 21/0245 (2013.01); H01L 21/02488 (2013.01); H01L 21/02658 (2013.01); H01L 21/324 (2013.01); H01L 27/1203 (2013.01)

(58) Field of Classification Search
CPC ........... H01L 21/76251; H01L 21/0245; H01L 21/02488; H01L 21/02658; H01L 21/324; H01L 27/1203
See application file for complete search history.

(56) References Cited

U.S. PATENT DOCUMENTS

| | | | |
|---|---|---|---|
| 2013/0104967 A1* | 5/2013 | Zhu | H01L 31/0236 136/255 |
| 2017/0062452 A1* | 3/2017 | Syu | H01L 29/792 |
| 2017/0243781 A1* | 8/2017 | Peidous | H01L 21/187 |
| 2018/0308928 A1* | 10/2018 | Cheng | H01L 29/0607 |
| 2019/0096745 A1 | 3/2019 | Wang | |

FOREIGN PATENT DOCUMENTS

| | | |
|---|---|---|
| TW | I262550 | 9/2006 |
| TW | 200915537 | 4/2009 |
| TW | 201308396 A1 | 2/2013 |

OTHER PUBLICATIONS

Jeanjean et al., "Dopant activation and Hall mobility in B- and As implanted polysilicon films after rapid or conventional thermal annealing," Semicond. Sci.Technol. 6 1130, 1991 (Year: 1991).*

* cited by examiner

Primary Examiner — Julia Slutsker
(74) Attorney, Agent, or Firm — Winston Hsu (57) ABSTRACT

A method of fabricating a semiconductor substrate includes the following steps. A carrier substrate is provided, and a plasma treatment is performed on the surface of the carrier substrate. A polycrystalline semiconductor layer is formed on the surface of the carrier substrate. A rapid thermal treatment is then performed on the polycrystalline semiconductor layer. A buried dielectric layer is then formed on the polycrystalline semiconductor layer. Afterwards, a single crystalline semiconductor layer is formed on the buried dielectric layer.

11 Claims, 7 Drawing Sheets

SEMICONDUCTOR SUBSTRATE AND METHOD OF FABRICATING THE SAME

CROSS REFERENCE TO RELATED APPLICATION

This application claims the benefit of Taiwan Patent Application No. 110115973, filed on May 4, 2021, the entire content of which is incorporated herein by reference.

BACKGROUND OF THE INVENTION

1. Field of the Invention

The present disclosure relates generally to the field of semiconductor substrates, and more particularly to semiconductor substrates with a buried dielectric layer and methods of fabricating the same.

2. Description of the Prior Art

In the integrated circuit manufacture, semiconductor-on-insulator (SOI) substrates are more and more important. Especially in the application of radio frequency circuits, the radio frequency semiconductor-on-insulator (RF-SOI) substrates are used widely. There is a trend to gradually replace the traditional epitaxial silicon substrate with the SOI substrate.

Currently, SOI substrates coordinated with radio frequency technology are mainly used in wireless communication fields such as smart phones, Wi-Fi, etc. Most of the radio frequency devices used in 3G/4G mobile phones have been upgraded from traditional compound semiconductor substrates to RF-SOI substrates. SOI substrates refer to an insulating material (i.e., a buried dielectric layer) disposed between a substrate and a semiconductor layer, which can adjust the resistance of the SOI substrates to improve the performances of the radio frequency devices.

As communication technology enters the 5G generation, the operating frequency bands of radio frequency devices will be changed from super high frequency (SHF) to extremely high frequency (EHF). However, when the radio frequency devices are operated at extremely high frequencies, more free charges are generated in the radio frequency devices to affect signal transmission. Therefore, it is necessary to improve the electronic performances of the radio frequency devices to meet the requirements of the radio frequency devices operated at extremely high frequencies.

SUMMARY OF THE INVENTION

In view of this, it is necessary to provide an improved semiconductor substrate and a method of fabricating the same to overcome the drawbacks of conventional technology.

According to one embodiment of the present disclosure, a method of fabricating a semiconductor substrate includes the following steps. A carrier substrate is provided. A plasma treatment is performed on a surface of the carrier substrate. A polycrystalline semiconductor layer is formed on the surface of the carrier substrate. A rapid thermal treatment is performed on the polycrystalline semiconductor layer. A buried dielectric layer is formed on the polycrystalline semiconductor layer, and a single crystalline semiconductor layer is formed on the buried dielectric layer.

According to one embodiment of the present disclosure, a semiconductor substrate includes a carrier substrate, a polycrystalline semiconductor layer, a buried dielectric layer, and a single crystalline semiconductor layer. The polycrystalline semiconductor layer is disposed on and indirect contact with a surface of the carrier substrate, where the polycrystalline semiconductor layer has a dopant concentration less than $10^{14}$ atom/cm$^{-3}$, a highest resistivity greater than $10^4$ Ω·cm, and a full width at half maximum (FWHM) of a diffraction characteristic peak of a crystal plane (311) being 0.35 to 0.45 radians. The buried dielectric layer is disposed on the polycrystalline semiconductor layer, and the single crystalline semiconductor layer is disposed on the buried dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In order to make the description of the present disclosure more detailed and complete, the following provides an illustrative description for the implementation aspects and embodiments of the present disclosure, but it is not the only way to implement or use the embodiments of the present disclosure. The implementation manners include the features of several embodiments, the steps of the method used to construct and operate these embodiments, and the sequence of the steps. However, other embodiments may also be used to achieve the same or equal functions and the sequence of the steps.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Although the numerical ranges and parameters used to define the wider range of the present disclosure are approximate numerical values, the relevant numerical values in the embodiments are presented here as accurately as possible. However, any numerical value inherently and inevitably contains standard deviations due to individual test methods. Here, "about" usually means that the actual numerical value is within plus or minus 10%, 5%, 1%, or 0.5% of a specific numerical value or range. Alternatively, the word "about" means that the actual numerical value falls within the acceptable standard error of the average value, depending on the consideration of a person having ordinary skill in the art of the present disclosure. Except for the experimental examples, or unless otherwise clearly stated, it should be understood that all ranges, quantities, numerical values and percentages used herein (for example, used to describe the amounts of materials, the time duration, temperatures, operating conditions, quantity ratios and other similar terms) have been modified in all instances by the term "about". Accordingly, unless indicated to the contrary, the numerical parameters set forth in the specification and the attached claims of the present disclosure are approximations that may vary as desired. At least these numerical parameters should be understood as the indicated effective numbers and the numerical values obtained by applying the general carry method. Here, the numerical ranges are expressed from one end point to another end point or between two end points. Unless otherwise expressly specified, all of the numerical ranges described herein include the end points.

Figure 1:
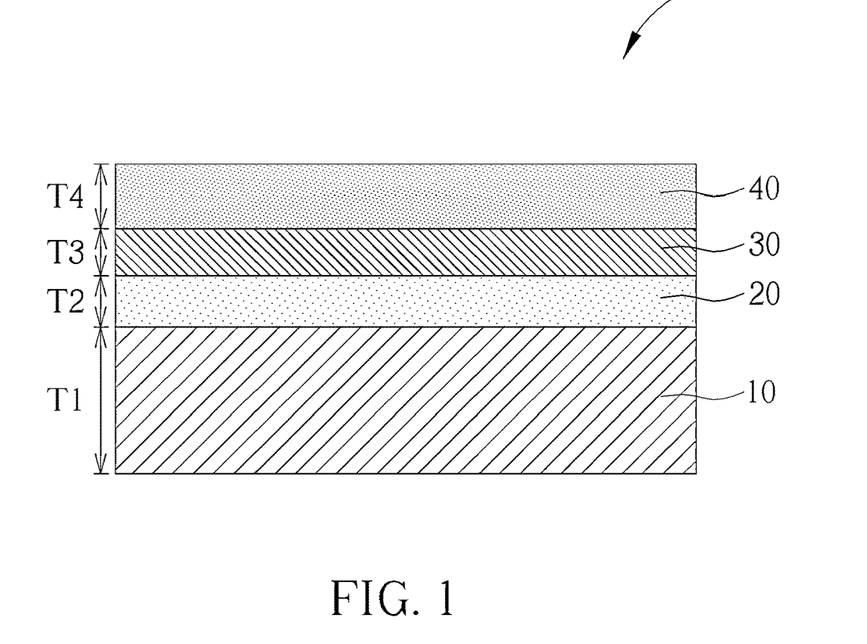
FIG. 1 is a schematic cross-sectional diagram of a semiconductor substrate according to one embodiment of the present disclosure.

FIG. 1 is a schematic cross-sectional diagram of a semiconductor substrate according to one embodiment of the present disclosure. As shown in FIG. 1, the semiconductor substrate 1 may be a semiconductor-on-insulator (SOI) substrate, which includes a carrier substrate 10, a polycrystalline semiconductor layer 20, a buried dielectric layer 30, and a single crystal semiconductor layer 40 stacked in sequence from bottom to top.

The carrier substrate 10 may be a semiconductor substrate or a ceramic substrate, such as a high-resistance silicon substrate or a glass substrate, or other suitable handle wafers, but not limited thereto. The thickness T1 of the carrier substrate 10 may be $1\times10^3$ micrometers (μm) to $1\times10^5$ micrometers, but not limited thereto.

The polycrystalline semiconductor layer 20 is a semiconductor layer with polycrystalline structure, such as a polysilicon layer. The polycrystalline semiconductor layer 20 is in direct contact with the carrier substrate 10, and the highest resistivity of the polycrystalline semiconductor layer 20 may be greater than the resistivity of the carrier substrate 10. The thickness T2 of the polycrystalline semiconductor layer 20 may be $8\times10^3$ Angstroms to $2\times10^4$ Angstroms, but not limited thereto. According to one embodiment of the present disclosure, the dopant concentration of the polycrystalline semiconductor layer 20 is less than $10^{14}$ cm$^{-3}$ and the highest resistivity thereof is greater than $10^4$ Ω·cm. In addition, the polycrystalline semiconductor layer 20 may include an upper region adjacent to the buried dielectric layer 30 and a lower region away from the buried dielectric layer 30, where the resistivity of the upper region is higher than the resistivity of other regions (for example, the lower region). Therefore, for the entire polycrystalline semiconductor layer 20, the upper region of the polycrystalline semiconductor layer 20 has the highest resistivity. According to one embodiment of the present disclosure, when the polycrystalline semiconductor layer 20 is a polysilicon layer, in the XRD inspection, the polysilicon layer produces diffraction characteristic peaks of crystal planes (111), (220), (311), and (400). The full width at half maximum (FWHM) of the crystal plane (311) is 0.35 radians to 0.45 radians, for example, 0.381 radians or 0.436 radians. Through the conversion formula of the grain size, such as the Scherrer formula, the grain size of the polysilicon layer is about 200 Angstroms to 300 Angstroms, such as 229.7 Angstroms or 262.4 Angstroms, but not limited thereto.

The buried dielectric layer 30 may be in direct contact with the polycrystalline semiconductor layer 20. The composition of the buried dielectric layer 30 may be an oxide layer or a nitride layer, but not limited thereto. The thickness T3 of the buried dielectric layer 30 may be $1\times10^4$ Angstroms to $5\times10^4$ Angstroms, but not limited thereto.

The single crystal semiconductor layer 40 may be in direct contact with the buried dielectric layer 30. The composition of the single crystal semiconductor layer 40 may be silicon, group III-V semiconductors, or group II-VI semiconductors, but not limited thereto. The thickness T4 of the single crystal semiconductor layer 40 may be $1\times10^3$ Angstroms to $5\times10^4$ Angstroms, but not limited thereto. In the case of using the semiconductor substrate 1 as the substrate of high-frequency devices, the single crystal semiconductor layer 40 may be used as a part of the active area of the high-frequency devices, so that carriers (for example, electrons or holes) are transferred in the single crystal semiconductor layer 40.

In the case of using the semiconductor substrate 1 as the substrate of high-frequency devices, the polycrystalline semiconductor layer 20 may serve as a trap rich layer for free charges. According to one embodiment of the present disclosure, the resistivity of the upper region of the polycrystalline semiconductor layer 20 may be higher than the resistivity of other regions of the polycrystalline semiconductor layer 20, and the grain size of the polycrystalline semiconductor layer 20 is about 200 Angstroms to about 300 Angstroms, so the polycrystalline semiconductor layer 20 has more grain boundaries. When the radio frequency device operates at extremely high frequency, the free charges generated by the radio frequency device are more easily captured by the polycrystalline semiconductor layer 20, thereby improving the transmission of high frequency signals.

Figure 2:
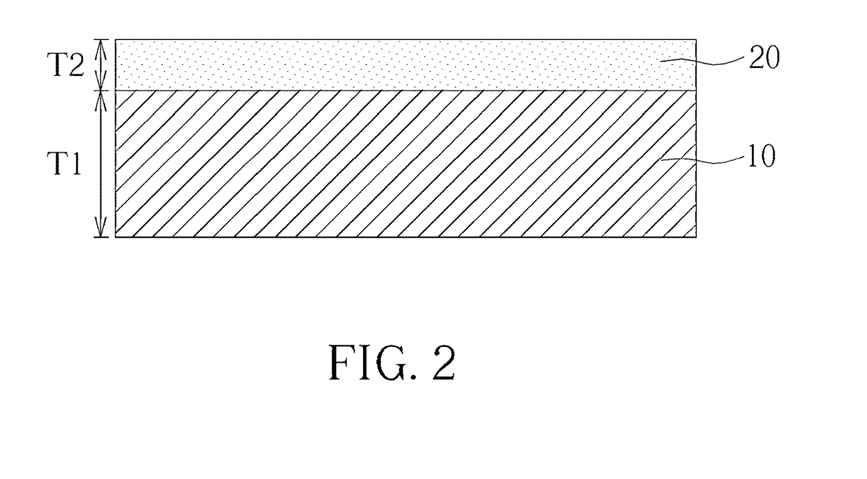
FIG. 2 is a schematic cross-sectional diagram of a carrier substrate with a polycrystalline semiconductor layer disposed thereon according to one embodiment of the present disclosure.
Figure 4:
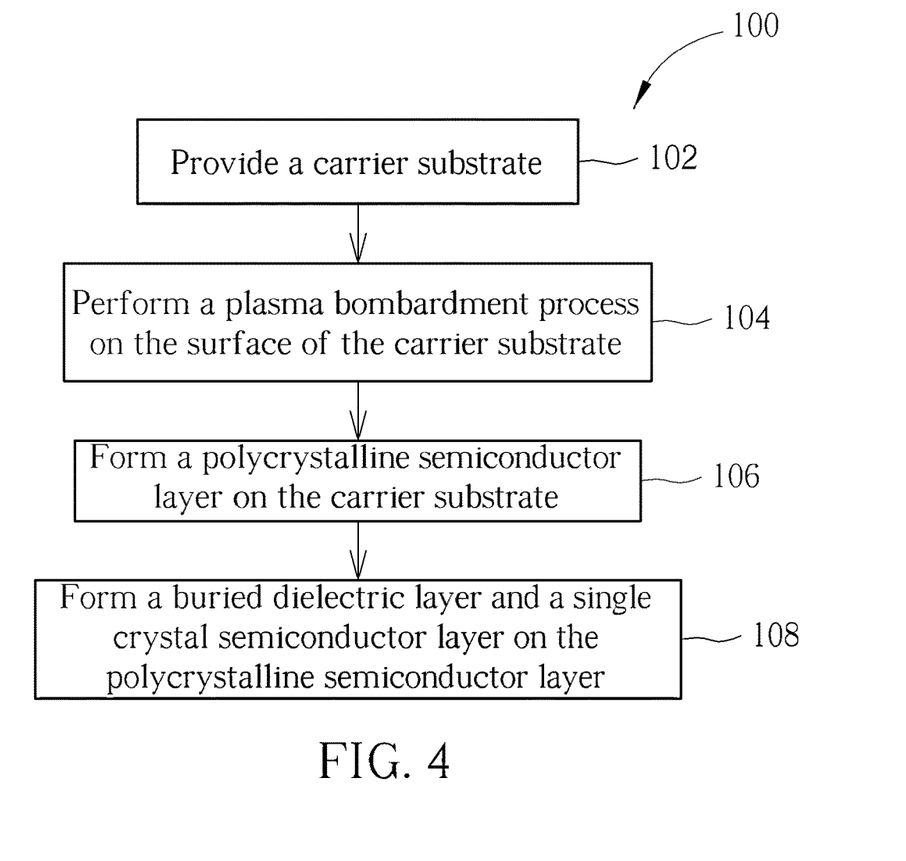
FIG. 4 is a flowchart illustrating a method of fabricating a semiconductor substrate according to one embodiment of the present disclosure.

The method of fabricating the semiconductor substrate of the present disclosure is further disclosed below. FIG. 2 is a schematic cross-sectional diagram of a carrier substrate with a polycrystalline semiconductor layer disposed thereon according to one embodiment of the present disclosure. FIG. 4 is a flowchart illustrating a method of fabricating a semiconductor substrate according to one embodiment of the present disclosure. First, step 102 of a fabrication method 100 is performed to provide a carrier substrate.

Then, step 104 is performed to perform a plasma treatment such as a plasma bombardment process on the surface of the carrier substrate 10. For example, an inert gas (such as Ne, Ar, Kr) or an etching gas (such as $N_2$, $O_2$, $N_2O$, $C_3F_8$) may be used to perform the plasma treatment on the carrier substrate 10, where the gas flow rate is 1500 to 8000 cc/min (preferred condition is 5000 cc/min), and the time duration of bombardment is 300 seconds to 1800 seconds (preferred condition is 1200 sec), so as to generate micro-defects (100 nm to 1000 nm) on the surface of the carrier substrate 10. According to one embodiment of the present disclosure, by performing step 104, a number of micro-defects are generated on the surface of the carrier substrate 10, and the surface roughness of the carrier substrate 10 is thereby increased. The micro-defects on the surface of the carrier substrate 10 may be used as nucleation points for subsequent formation of a polycrystalline semiconductor layer.

Afterwards, step 106 is performed to form a polycrystalline semiconductor layer 20 on the carrier substrate 10, and a rapid thermal treatment is performed on the polycrystalline semiconductor layer 20 to obtain the structure shown in FIG. 2. For example, the polycrystalline semiconductor layer 20 may be deposited on the surface of the carrier substrate 10 through a physical vapor deposition or chemical vapor deposition process. The polycrystalline semiconductor layer 20 may be polysilicon, the deposition temperature thereof is 600° C. to 900° C. (preferred condition is 670° C.), and the thickness thereof is $8\times10^3$ Angstroms (Å) to $2\times10^4$ Angstroms (preferred condition is $1.5\times10^4$ Å). The rapid thermal treatment may be a rapid thermal procedure (RTP) process, the treatment temperature is 750° C. to 1250° C. (preferred condition is 1230° C.), and the time duration of treatment is 5 seconds to 60 seconds (the preferred condition is 20 seconds). According to one embodiment of the present disclosure, by performing step 106 and performing the rapid thermal treatment on the polycrystalline semiconductor layer 20, the resistivity of the polycrystalline semiconductor layer 20 is changed from a first resistivity (for example, $10^2$ Ω·cm) to a second resistivity (for example, $10^5$ Ω·cm), and the ratio of the second resistivity to the first resistivity is at least greater than 500. In addition, by performing the rapid thermal treatment on the polycrystalline semiconductor layer 20, the rate of change of resistivity of the upper region of the polycrystalline semiconductor layer 20 is changed from a first rate of change of resistivity to a second rate of change of resistivity, and the second rate of change of resistivity is less than the first rate of change of resistivity. In addition, after the rapid thermal treatment is performed on the polycrystalline semiconductor layer 20, the grain size of the polycrystalline semiconductor layer 20 is increased.

Figure 3:
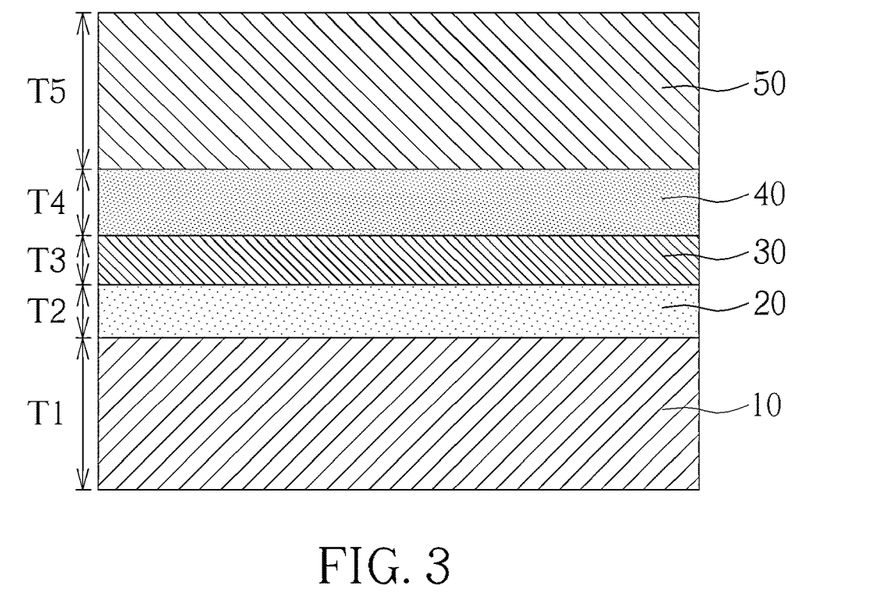
FIG. 3 is a schematic cross-sectional diagram of a carrier substrate with a polycrystalline semiconductor layer, a buried dielectric layer, a single crystalline semiconductor layer and a bonding substrate disposed thereon according to one embodiment of the present disclosure.

FIG. 3 is a schematic cross-sectional diagram of a carrier substrate with the polycrystalline semiconductor layer, a buried dielectric layer, a single crystalline semiconductor layer and a bonding substrate disposed thereon according to one embodiment of the disclosure. After the structure shown in FIG. 2 is obtained, step 108 is performed to form a buried dielectric layer 30 and a single crystal semiconductor layer 40 on the polycrystalline semiconductor layer 20 to obtain the structure shown in FIG. 3. As shown in FIG. 3, according to one embodiment of the present disclosure, the buried dielectric layer 30 may be deposited on the surface of the carrier substrate 10 through a physical vapor deposition or chemical vapor deposition process. Thereafter, a bonding process is used to bond a single crystal semiconductor layer 40 disposed on the surface of a bonding substrate 50 to the buried dielectric layer 30. The bonding substrate 50 may be a semiconductor substrate or a ceramic substrate, and its thickness T5 is about $1\times10^3$ micrometers (μm) to $1\times10^5$ micrometers, but not limited thereto. In addition, the buried dielectric layer 30 is not limited to being directly deposited on the surface of the polycrystalline semiconductor layer 20. For example, the buried dielectric layer 30 may be first disposed on the surface of another carrier substrate that is separated from the carrier substrate 10, such as be disposed on the surface of the bonding substrate 50, and then the buried dielectric layer 30 disposed on the surface of the bonding substrate 50 is bonded to the surface of the polycrystalline semiconductor layer 20 through a bonding process.

After the structure shown in FIG. 3 is completed, a polishing process may be performed on the bonding substrate 50 to remove the bonding substrate 50 until the single crystal semiconductor layer 40 is exposed, and then the structure shown in FIG. 1 is obtained.

In order to enable those skilled in the art to realize the present disclosure, the examples of the present disclosure will be described in detail below to specifically describe the method of fabricating the semiconductor substrate. It should be noted that the following examples are only illustrative, and the present disclosure should not be limited thereto. That is, without going beyond the scope of the present disclosure, the materials, the amounts and ratios of the materials, and the processing flow used in the examples may be appropriately changed.

Example 1

A plasma bombardment process is applied to the surface of a carrier substrate to form micro-defects (100 nm to 1000 nm) on the surface of the carrier substrate. The process gas is $N_2/N_2O/O_2$ or $C_3F_8$, the gas flow rate is 5000 cc/min, and the time duration of bombardment is 1200 seconds. Then, a polysilicon layer is deposited on the surface of the carrier substrate, and the dopant concentration of the polysilicon layer is lower than $10^{14}$ $cm^{-3}$. The deposition temperature of the polysilicon layer is 670° C., and the thickness of the polysilicon layer is $1\times10^4$ Å. Then, a rapid high temperature annealing process is performed on the polysilicon layer at a processing temperature of 1230° C. and a time duration of 30 seconds. Thereafter, an oxide layer (i.e., the buried dielectric layer) is formed on the polysilicon layer, and then a bonding process is performed to bond a single crystalline silicon layer (i.e., the single crystalline semiconductor layer) to the oxide layer, where the single crystalline silicon layer is disposed on another carrier substrate, and thus the semiconductor substrate is obtained.

Comparative Example 1

The main difference between comparative example 1 and example 1 is that, after depositing the polysilicon layer on the surface of the carrier substrate, the high temperature annealing process is not performed on the polysilicon layer of comparative example 1.

Comparative Example 2

The main difference between comparative example 2 and example 1 is that, before depositing the polysilicon layer on the surface of the carrier substrate, the plasma bombardment process is not performed on the surface of the carrier substrate of comparative example 2.

Several inspections may be performed on the semiconductor substrates of the above-mentioned example 1 and comparative examples 1 and 2. The inspection items include transmission electron microscopy inspection, X-ray diffraction spectroscopy inspection, and resistivity measurement.

<Transmission Electron Microscopy Inspection>

Figure 5:
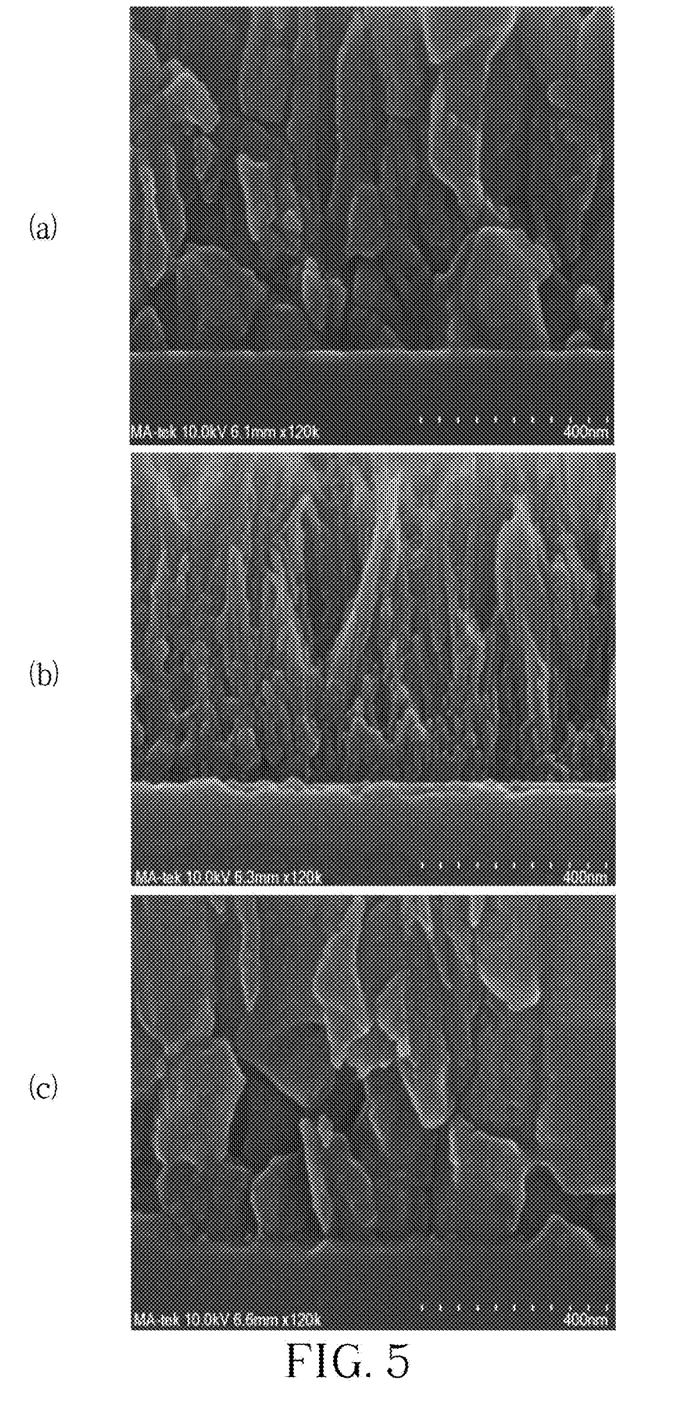
FIG. 5 is the transmission electron microscopy images of the polysilicon layers of the semiconductor substrates according to examples of the present disclosure.

The polysilicon layers of the semiconductor substrates of example 1 and comparative examples 1 and 2 are inspected by a transmission electron microscope, and the results are shown in FIG. 5. The images (a), (b), and (c) in FIG. 5 correspond to example 1, comparative example 1, and comparative example 2, respectively. As shown in FIG. 5, since example 1 (FIG. 5(a)) and comparative example 2 (FIG. 5(c)) have undergone the rapid high temperature annealing process, the grain sizes of the polysilicon layers thereof are significantly larger than the grain size of polysilicon layer of comparative example 1 (FIG. 5(b)).

<X-Ray Diffraction Spectroscopy Inspection>

Figure 6:
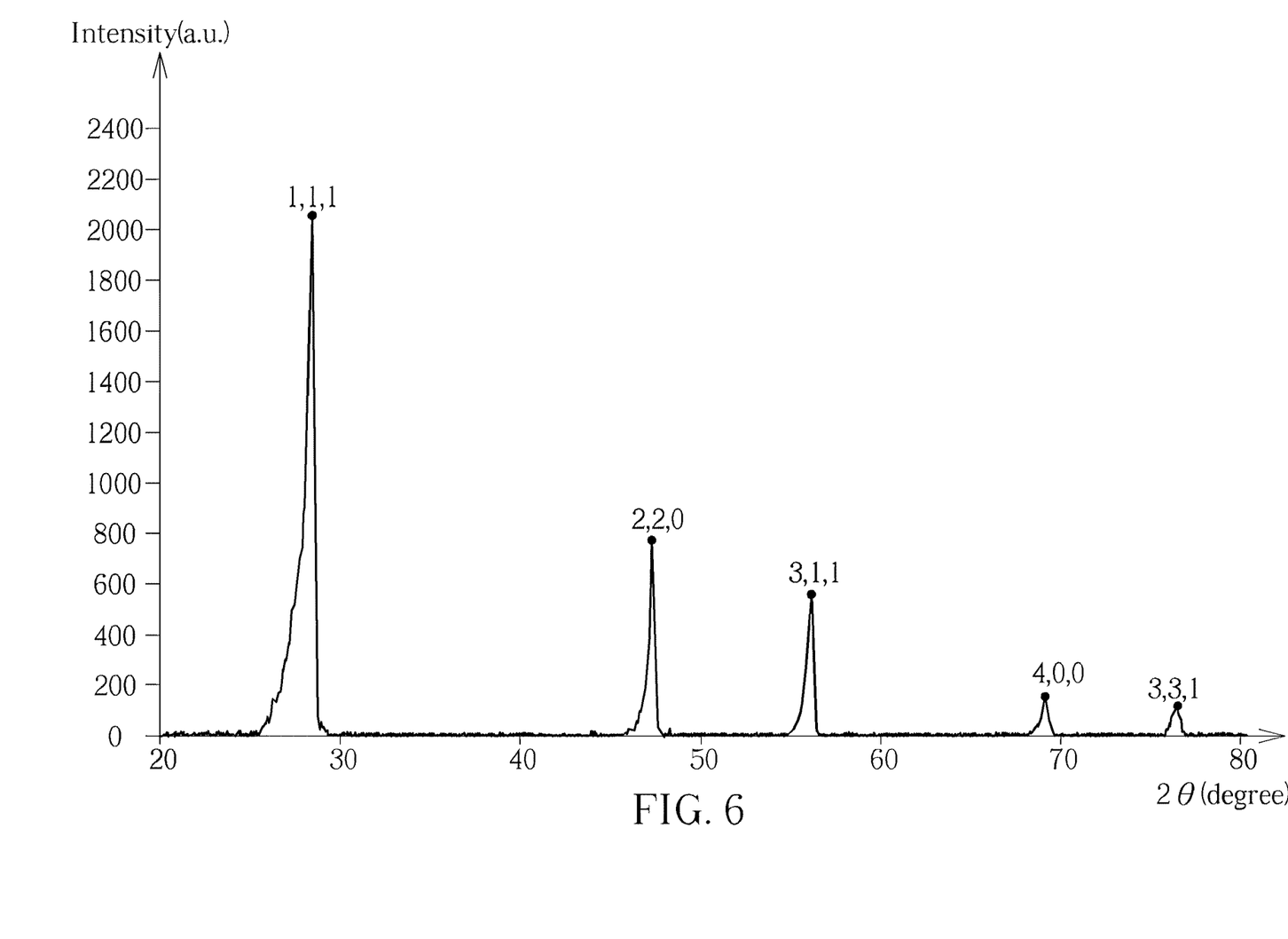
FIGS. 6 and 7 are the X-ray diffraction spectra of the polysilicon layers of the semiconductor substrates according to examples of the present disclosure.
Figure 7:
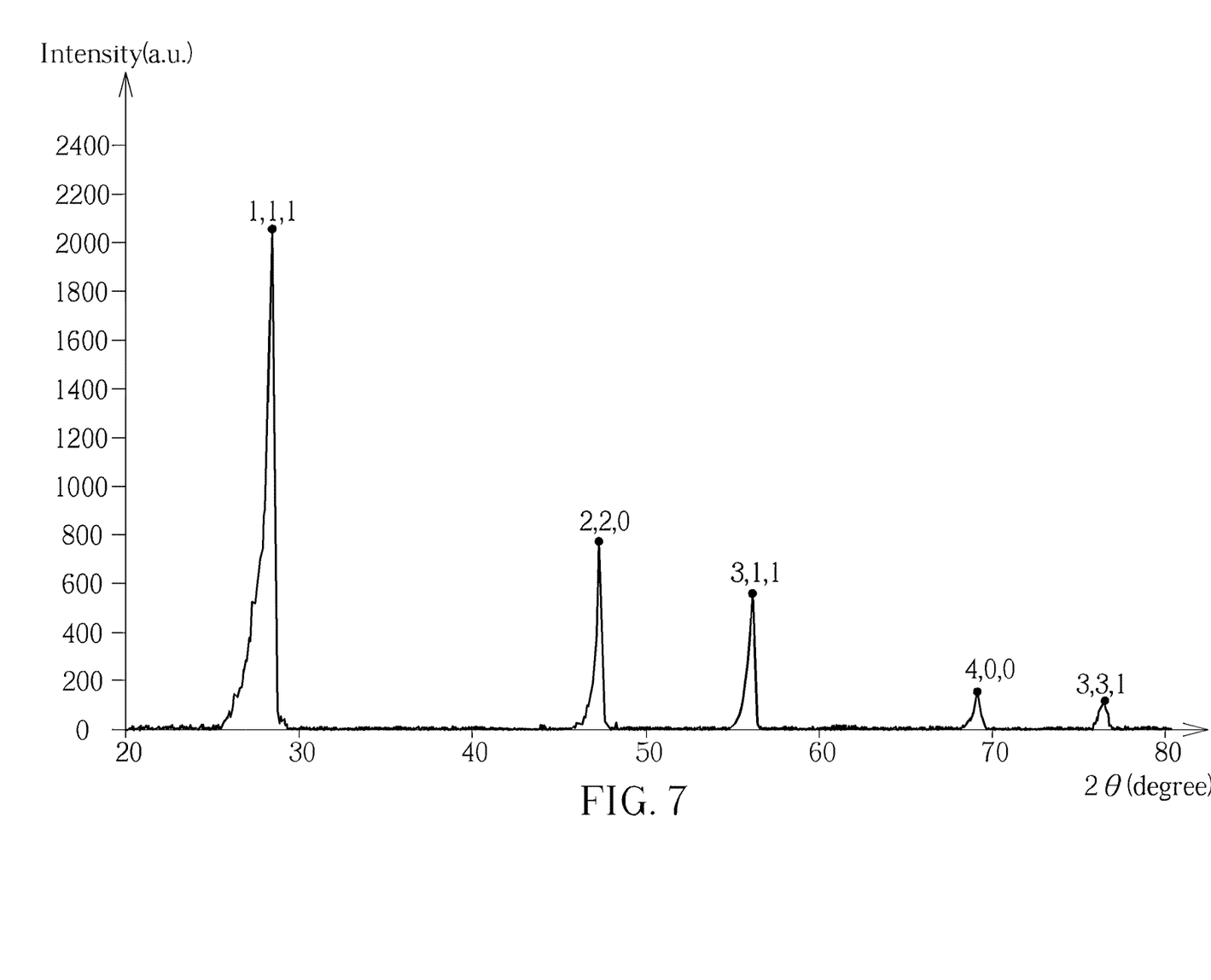

The polysilicon layers of the semiconductor substrates of example 1 and comparative example 2 are inspected by X-ray diffraction spectroscopy, and the results are shown in FIG. 6 and FIG. 7, respectively. As shown in FIG. 6 and FIG. 7, the diffraction characteristic peaks from left to right correspond to the crystal planes (111), (220), (311), and (400) of silicon, respectively. This represents that the polysilicon layers of example 1 and comparative example 2 indeed contain crystalline silicon. In addition, based on the full width at half maximum (FWHM) of the crystal plane (311), the grain size of crystalline silicon is calculated by using the Scherrer formula. Since the FWHM of the crystal plane (311) in FIG. 6 is 0.436, and the FWHM of the crystal plane (311) in FIG. 7 is 0.381, by using the Scherrer formula to calculate, the corresponding grain sizes are 229.7 Angstroms and 262.4 Angstroms, respectively. Since the main difference between comparative example 2 and example 1 is that before depositing the polysilicon layer on the surface of the carrier substrate, the plasma bombardment process is not performed on the surface of the carrier substrate of comparative example 2. This proves that the plasma bombardment process indeed reduces the grain size of the polysilicon layer.

<Resistivity Measurement>

Figure 8:
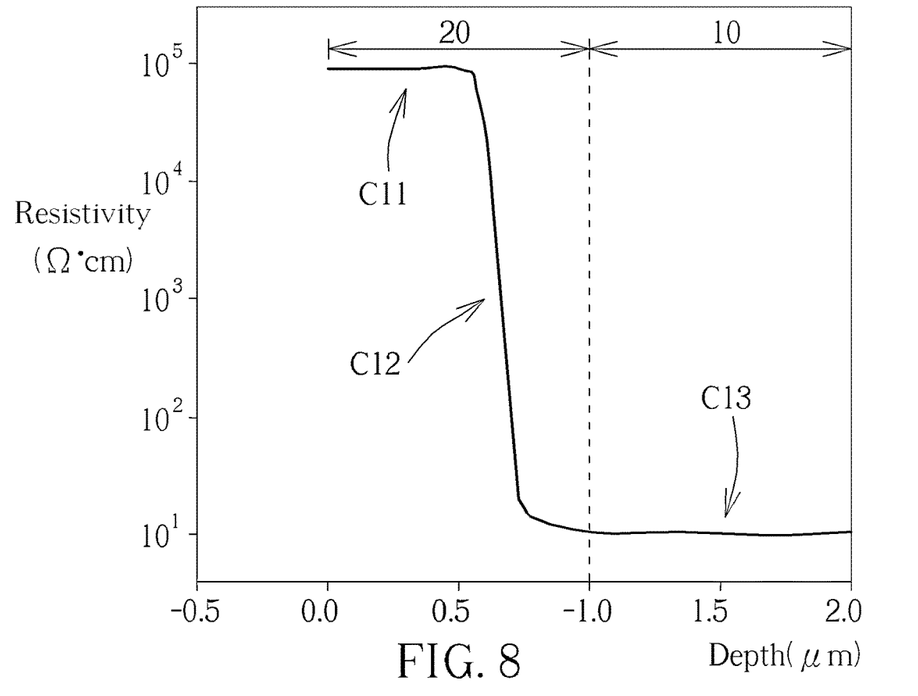
FIGS. 8 to 10 are the results of the spreading resistance profiling of the semiconductor substrates according to examples of the present disclosure.
Figure 9:
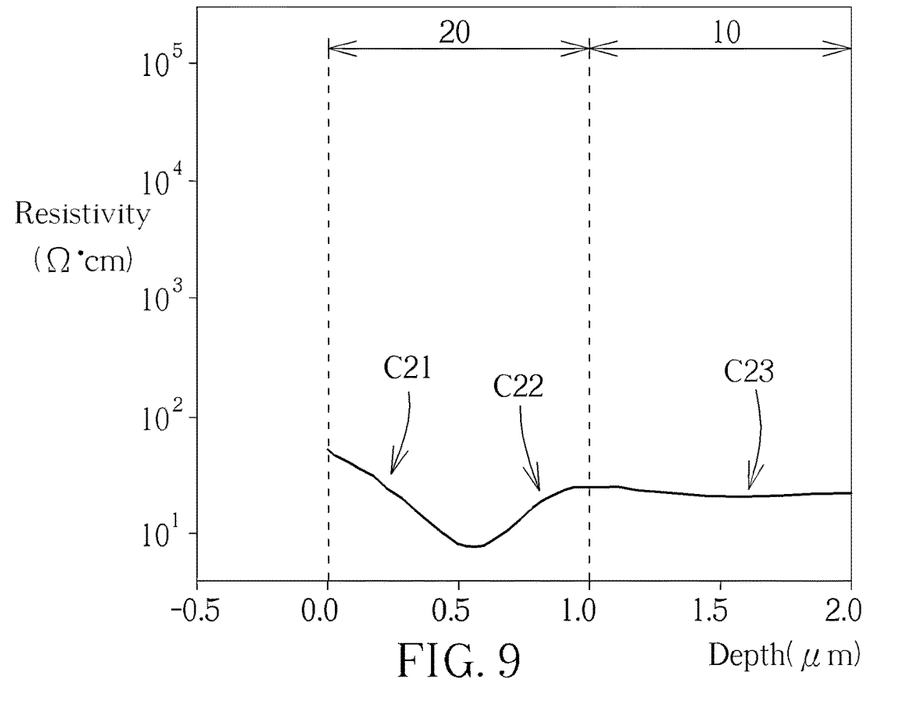
Figure 10:
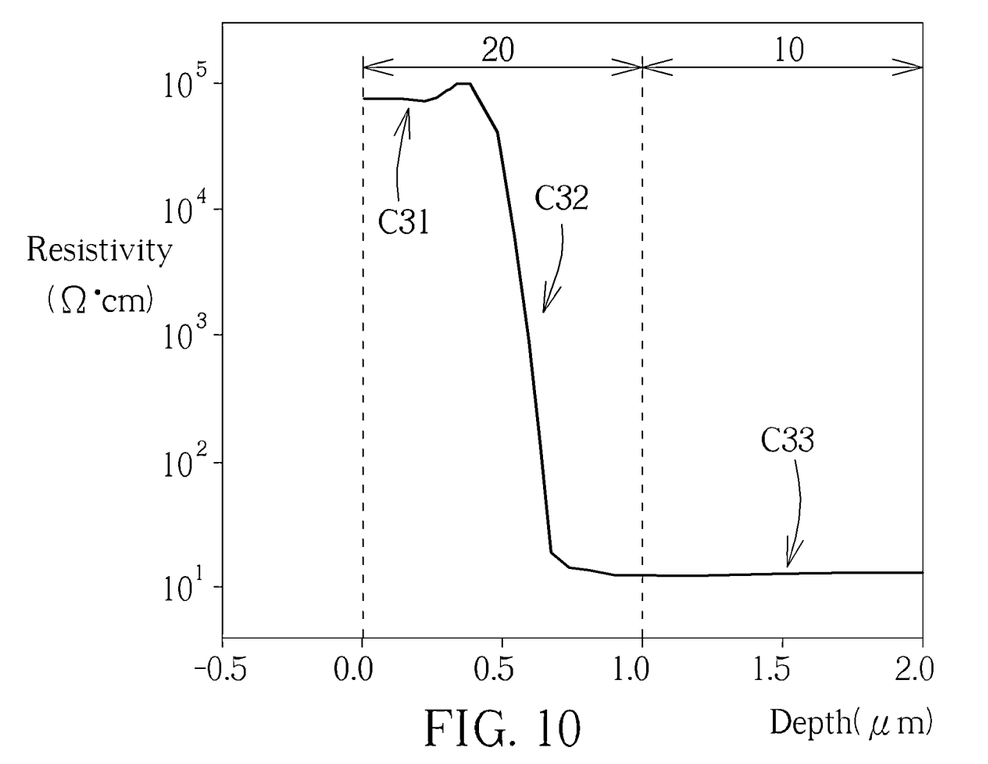

Spreading resistance profiling (SRP) is performed on the semiconductor substrates of example 1, comparative example 1, and comparative example 2 to confirm the relationship between resistivity and different depths. The results are shown in FIGS. 8 to 10 respectively. In FIGS. 8 to 10, the depth of 0 corresponds to the top surface of the polysilicon layer (that is, the surface of the polysilicon layer away from the carrier substrate).

As shown in FIG. 8, the changes of resistivity correspond to the curves C11, C12, C13, where the curve C11 is located in the upper region of the polysilicon layer, the curve C12 is located in the lower region of the polysilicon layer, and the curve C13 is located in the carrier substrate. In FIG. 8, within the depth of 0 to 0.5 µm, the change of resistivity corresponds to the curve C11, and the resistivity of each point on the curve C11 is maintained at about $10^5$ Ω·cm. Within the depth of 0.5 to 1.0 µm, the change of resistivity corresponds to the curve C12, and as the depth increases, the resistivity of each point on the curve C12 drops significantly from about $10^5$ Ω·cm to $10^1$ Ω·cm. Within the depth of 1.0 to 2.0 µm, the change of resistivity corresponds to the curve C13, and the resistivity of each point on the curve C13 is about $10^1$ Ω·cm.

As shown in FIG. 9, the changes of resistivity correspond to the curves C21, C22, and C23, where the curve C21 is located in the upper region of the polysilicon layer, the curve C22 is located in the lower region of the polysilicon layer, and the curve C23 is located in the carrier substrate. In FIG. 9, within the depth of 0 to 0.5 µm, the change of resistivity corresponds to the curve C21, and as the depth increases, the resistivity of each point on the curve C21 drops from about $10^2$ Ω·cm to $10^1$ Ω·cm, and then slowly rises to $2\times10^1$ Ω·cm. Within the depth of 0.5 to 1.0 µm, the change of resistivity corresponds to the curve C22, and as the depth increases, the resistivity of each point on the curve C22 slowly rises from about $10^1$ Ω·cm to $2\times10^1$ Ω·cm. Within the depth of 1.0 to 2.0 µm, the change of resistivity corresponds to the curve C23, and the resistivity of each point on the curve C23 is slightly greater than $10^1$ Ω·cm.

As shown in FIG. 10, the changes of resistivity correspond to the curves C31, C32 and C33, where the curve C31 is located in the upper region of the polysilicon layer, the curve C32 is located in the lower region of the polysilicon layer, and the curve C33 is located in the carrier substrate. In FIG. 10, within the depth of 0 to 0.4 µm, the change of resistivity corresponds to the curve C31, and the resistivity of each point on the curve C31 is about $10^5$ Ω·cm. Within the depth of 0.4 to 1.0 µm, the change of resistivity corresponds to the curve C32, and as the depth increases, the resistivity of each point on the curve C32 drops significantly from about $10^5$ Ω·cm to $10^1$ Ω·cm. Within the depth of 1.0 to 2.0 µm, the change of resistivity corresponds to the curve C33, and the resistivity of each point on the curve C33 is about $10^1$ Ω·cm.

According to the results of resistivity measurement, compared to the semiconductor substrate that has not been processed by the rapid high temperature annealing treatment (FIG. 9), when the semiconductor substrates are subjected to the rapid high temperature annealing treatment, the resistivity of the polysilicon layers, especially the resistivity of the upper region of the polysilicon layers, are increased (FIG. 8 and FIG. 10).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor substrate, comprising:
   providing a carrier substrate including a surface;
   performing a plasma treatment on the surface of the carrier substrate;
   forming a polycrystalline semiconductor layer on the surface of the carrier substrate;
   performing a rapid thermal treatment on the polycrystalline semiconductor layer;
   forming a buried dielectric layer on the polycrystalline semiconductor layer; and
   forming a single crystalline semiconductor layer on the buried dielectric layer,
   wherein the polycrystalline semiconductor layer comprises an upper region adjacent to the buried dielectric layer and a lower region away from the buried dielectric layer, and when the rapid thermal treatment is performed on the polycrystalline semiconductor layer, an increase in resistivity of the upper region is greater than an increase in resistivity of the lower region.

2. The method of fabricating the semiconductor substrate of claim 1, wherein when the plasma treatment is performed, a plurality of micro-defects is formed on the surface of the carrier substrate to increase the roughness of the surface of the carrier substrate, and the micro-defects are nucleation points for the polycrystalline semiconductor layer.

3. The method of fabricating the semiconductor substrate of claim 1, wherein a gas used in the plasma treatment comprises Ne, Ar, Kr, $N_2$, $O_2$, $N_2O$, $C_3F_8$ or a combination thereof.

4. The method of fabricating the semiconductor substrate of claim 1, wherein the time duration of the plasma treatment is from 300 seconds to 1800 seconds.

5. The method of fabricating the semiconductor substrate of claim 1, wherein the processing temperature of the rapid thermal treatment is from 750° C. to 1250° C.

6. The method of fabricating the semiconductor substrate of claim 1, wherein the time duration of the rapid thermal treatment is from 5 seconds to 60 seconds.

7. The method of fabricating the semiconductor substrate of claim 1, wherein before performing the rapid thermal treatment, the polycrystalline semiconductor layer has a first resistivity, and after performing the rapid thermal treatment, the polycrystalline semiconductor layer has a second resistivity, and the ratio of the second resistivity to the first resistivity is greater than 500.

8. The method of fabricating the semiconductor substrate of claim 1, wherein before performing the rapid thermal treatment, the polycrystalline semiconductor layer has a first rate of change of resistivity, and after performing the rapid thermal treatment, the polycrystalline semiconductor layer has a second rate of change of resistivity, and the second rate of change of resistivity is less than the first rate of change of resistivity.

9. The method of fabricating the semiconductor substrate of claim 1, wherein forming the buried dielectric layer on the polycrystalline semiconductor layer comprises performing an oxidation process, a deposition process or a bonding process.

10. The method of fabricating the semiconductor substrate of claim 1, wherein forming the single crystalline semiconductor layer on the buried dielectric layer comprises performing a bonding process.

11. The method of fabricating the semiconductor substrate of claim 1, wherein the polycrystalline semiconductor layer is in direct contact with the surface of the carrier substrate, and the buried dielectric layer is in direct contact with the polycrystalline semiconductor layer.

\* \* \* \* \*